United States Patent
Butler

(10) Patent No.: US 11,543,756 B2
(45) Date of Patent: Jan. 3, 2023

(54) LITHOGRAPHIC APPARATUS AND METHOD

(71) Applicant: ASML Netherlands B.V., Veldhoven (NL)

(72) Inventor: Hans Butler, Best (NL)

(73) Assignee: ASML Netherlands B.V., Veldhoven (NL)

( * ) Notice: Subject to any disclaimer, the term of this patent is extended or adjusted under 35 U.S.C. 154(b) by 141 days.

(21) Appl. No.: 16/959,702

(22) PCT Filed: Nov. 29, 2018

(86) PCT No.: PCT/EP2018/082982
§ 371 (c)(1),
(2) Date: Jul. 2, 2020

(87) PCT Pub. No.: WO2019/134775
PCT Pub. Date: Jul. 11, 2019

(65) Prior Publication Data
US 2021/0132505 A1   May 6, 2021

(30) Foreign Application Priority Data

Jan. 4, 2018 (EP) .................................... 18150316

(51) Int. Cl.
*G03F 7/20* (2006.01)

(52) U.S. Cl.
CPC .............. *G03F 7/709* (2013.01); *G03F 7/706* (2013.01); *G03F 7/70508* (2013.01); *G03F 7/70825* (2013.01)

(58) Field of Classification Search
CPC ...... G03F 7/706; G03F 7/70825; G03F 7/709; G03F 7/7066; G03F 7/70775;
(Continued)

(56) References Cited

U.S. PATENT DOCUMENTS

2003/0090645 A1   5/2003   Kato
2008/0037029 A1   2/2008   Nawata
(Continued)

FOREIGN PATENT DOCUMENTS

EP   1 513 017 A1   3/2005
EP   2 202 426 A2   6/2010
(Continued)

OTHER PUBLICATIONS

International Search Report and Written Opinion of the International Searching Authority directed to related International Patent Application No. PCT/EP2018/082982, dated Mar. 28, 2019; 11 pages.

*Primary Examiner* — Christina A Riddle
(74) *Attorney, Agent, or Firm* — Sterne, Kessler, Goldstein & Fox P.L.L.C.

(57) ABSTRACT

A lithographic apparatus comprises a projection system comprising position sensors to measure a position of optical elements of the projection system. The positions sensors are referenced to a sensor frame. Damping actuators damp vibrations of the sensor frame. A control device drives the actuators and is configured to derive sensor frame damping force signals from at least one of the acceleration signals and the sensor frame position signals, derive an estimated line of sight error from the position signals, determine actuator drive signals from the sensor frame damping force signals and the estimated line of sight error, drive the actuators using the actuator drive signals to dampen the sensor frame and to at least partly compensate the estimated line of sight error.

11 Claims, 3 Drawing Sheets

(58) Field of Classification Search
CPC .. G03F 7/708; G03F 7/70808; G03F 7/70816; G03F 7/70833; G03F 7/70841; G03F 7/7085; G03F 7/70858; G03F 7/70975; G03F 7/70991; G03F 7/70483–70533
USPC .............................. 355/18, 30, 52–55, 67–77
See application file for complete search history.

(56) References Cited

U.S. PATENT DOCUMENTS

2009/0180092 A1    7/2009  Butler et al.
2011/0170078 A1*   7/2011  Loopstra ............. G03F 7/70825
                                                      355/77
2012/0105819 A1*   5/2012  Butler .................... G03F 7/709
                                                      355/72

FOREIGN PATENT DOCUMENTS

WO    WO 2010/037575 A1    4/2010
WO    WO 2016/087177 A1    6/2016

* cited by examiner

LITHOGRAPHIC APPARATUS AND METHOD

CROSS-REFERENCE TO RELATED APPLICATIONS

This application claims priority of EP application 18150316.0 which was filed on 4 Jan. 2018 and which is incorporated herein in its entirety by reference.

FIELD

The present invention relates to a lithographic apparatus and a method of reducing a line of sight error in such a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The lithographic apparatus comprises a projection system configured to project a patterned radiation beam onto the target portion of the substrate. The projection system comprises optical elements such as reflective optical elements, e.g. reflecting mirrors, or transmissive optical elements, such as lenses. The optical elements may be positioned by optical element actuators: the optical element actuators may for example be driven to counteract vibrations, thermal effects, positioning inaccuracy, etc. Accordingly, a position of the optical elements is measured using position sensors. In order to detect a position of the optical elements, position sensors may be provided to measure a position of the optical elements. The optical elements actuators are arranged between, i.e. act between a force frame and the optical elements. In order to provide an accurate position sensing of the position of the optical elements, a sensor frame is provided, the position sensors sensing a position of the optical elements in respect of the sensor frame. The sensor frame is supported by the force frame using vibration isolators. Hence, the vibration isolators aim to keep vibrations acting in the force frame away from the sensor frame, thus to keep disturbances away as much as possible from the position sensors sensing the position of the optical elements.

A problem associated with the sensor frame is that vibrations acting in the force frame and movements of the force frame may translate, via the vibration isolators, into disturbance forces on the sensor frame. The disturbance forces on the sensor frame may translate into position errors, as the position sensors measure a position of the optical elements in respect of the sensor frame. Sensor frame actuators may be provided to dampen the sensor frame, thus e.g. to counteract accelerations of the sensor frame and/or displacement of the sensor frame. Thereto, acceleration sensors and/or sensor frame position sensors may be provided to measure an acceleration resp. a position of the sensor frame and the sensor frame actuators may be driven to at least partly compensate such accelerations and/or displacements so as to attempt to compensate for such disturbances on the sensor frame.

The inventors have however observed that the attempt to compensate for such disturbances on the sensor frame appears to be counter effective, and causing an overall decrease in projection accuracy instead of an envisaged increase in projection accuracy. In particular, a line of sight error appears to increase instead of the envisaged decrease.

SUMMARY

It is desirable to promote keeping a line of sight error low.

According to an aspect of the invention, there is provided a lithographic apparatus comprising: a projection system configured to project a patterned radiation beam onto a target portion of a substrate, wherein the projection system comprises i. a plurality of optical elements configured to optically interact with the patterned radiation beam to project the patterned radiation beam onto the target portion of the substrate,
ii. a plurality of optical element position sensors,
iii. a sensor frame to which the optical element position sensors are mounted, the optical element position sensor configured to measure a position of the optical elements in respect of the sensor frame,
iv. a force frame,
v. a plurality of vibration isolators connected between the force frame and the sensor frame, the force frame being configured to support the sensor frame via the vibration isolators, the vibration isolators being configured to isolate the sensor frame from vibrations in the force frame,
vi. a plurality of sensor frame position sensors configured to measure a position of the sensor frame in respect of the force frame,
vii. a plurality of acceleration sensors configured to measure an acceleration of the sensor frame, and
viii. a plurality of actuators arranged between the sensor frame and the force frame and configured to exert a force between the sensor frame and the force frame, and the lithographic apparatus further comprising a control device, the control device comprising:

ix. an acceleration sensor input to which the acceleration sensors are connected to provide acceleration signals representative of the acceleration of the sensor frame to the control device,
x. a position sensor input to which the sensor frame position sensors are connected to provide position signals representative of the position of the sensor frame relative to the force frame to the control device,
xi. an actuator output connected to the actuators to enable the control device to drive the actuators, wherein the control device is configured to
xii. derive sensor frame damping force signals from at least one of the acceleration signals and the position signals, xiii. derive an estimated line of sight error from the position signals, xiv. determine actuator drive signals from the sensor frame damping force signals and the estimated line of sight error, xv. drive the actuators using the actuator drive signals to dampen the sensor frame and to at least partly compensate the estimated line of sight error.

According to another aspect of the invention, there is provided a method of reducing a line of sight error in a lithographic apparatus according to the invention, the lithographic apparatus comprising:

wherein the sensor frame damping force signals are N degrees of freedom sensor frame damping force signals,
wherein the estimated line of sight error is a M degrees of freedom estimated line of sight error,
wherein the actuator drive signals are N+M actuator drive signals,
wherein the plurality of actuators are N+M actuators, and
wherein the actuator drive signals are determined from the sensor frame damping force signals and the estimated line of sight error using an N+M times N+M matrix,
the method comprising:
determining the actuator drive signals from the sensor frame damping force signals and the estimated line of sight error using the N+M times N+M matrix (G), the N+M times N+M matrix being determined by:
providing an N times N+M matrix (V) expressing an N degree of freedom force on the sensor frame as a result on an actuation of the N+M actuators,
providing an M times N+M matrix (W) expressing a M dimensional line of sight error as a result of the forces of the N+M actuators
combining the N times N+M matrix (V) and the M times N+M (W) matrix into an intermediary N+M times N+M matrix, and
determining the N+M times N+M matrix (G) as an inverse of the intermediary N+M times N+M matrix.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
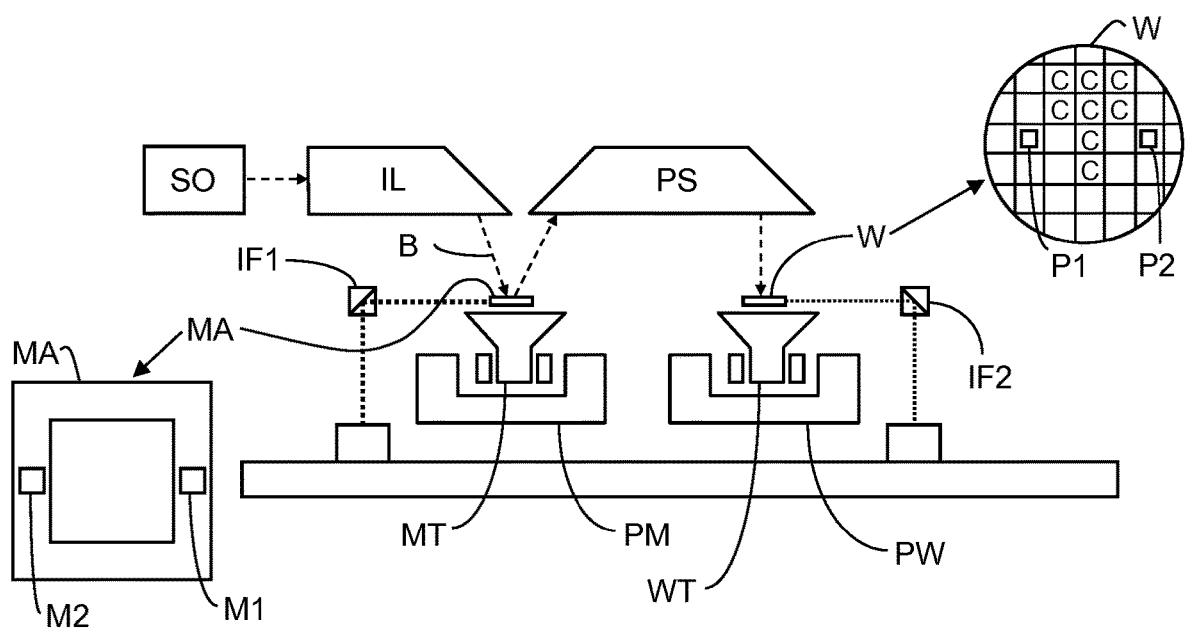
FIG. 1 depicts a lithographic apparatus in which the invention may be embodied.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask). The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
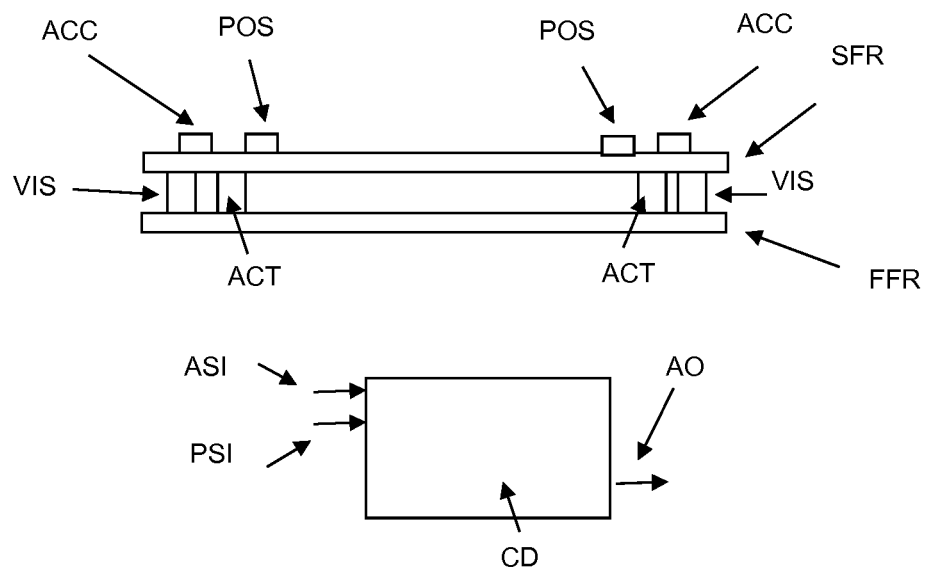
FIG. 2 depicts a schematic drawing of a projection system of a lithographic apparatus according to an embodiment of the invention.

FIG. 2 depicts a part of a projection system as may be employed in the lithographic apparatus in accordance with FIG. 1. The projection system is configured to project a patterned radiation beam onto the target portion of the substrate. The patterned radiation beam may have been generated from any radiation source, such as an ultraviolet, UV, Deep ultra violet, DUV, or an extreme UV, EUV radiation source, i.e. a radiation source emitting UV, DUV respectively EUV radiation. The radiation beam may be patterned using any suitable patterning technique, such as a patterning device, e.g. a mask, or any other patterning. The projection system comprises optical elements such as reflective optical elements, e.g. reflecting mirrors, or transmissive optical elements, such as lenses, prisms, etc., or a combination of transmissive and reflective optical elements. An optical transfer function of the projection system is determined, amongst others, by the optical properties of the optical elements, as well by the positions of the optical elements.

The optical elements may be positioned by optical element actuators: the optical element actuators may for example be driven to counteract vibrations, thermal effects, positioning inaccuracy, etc., thus to keep the optical elements at their intended position. Accordingly, a position of the optical elements is measured. In order to detect the position of the optical elements, optical element position sensors may be provided. The optical elements actuators are arranged between, i.e. act between a force frame FFR of the projection system and the optical elements. The force frame may be subject to disturbances, such as the forces by the actuators. In order to enhance an accurate position sensing of the position of the optical elements, a sensor frame SFR is provided, the optical element position sensors sensing a position of the optical elements in respect of the sensor frame. The sensor frame is supported by the force frame using vibration isolators VIS. Hence, the vibration isolators aim to keep vibrations acting in the force frame away from the sensor frame, thus to aim to keep disturbances away from the position sensors.

Acceleration sensors ACC are provided on the sensor frame. The acceleration sensors sense an acceleration of the sensor frame. The acceleration sensors may be also formed by velocity sensors, e.g. a time derivative if a velocity signal by the velocity sensors providing an acceleration signal. For example, geophones may be applied. Alternatively or additionally, sensor frame position sensors POS are provided on the sensor frame. The sensor frame position sensors sense a position of the sensor frame. Based on the acceleration signals provided by the acceleration sensors, and/or the position signals of the sensor frame position sensors, a control device CD of the lithographic apparatus calculates a damping force signal that represents a damping force that is to be exerted on the sensor frame in order to dampen and/or position the sensor frame. Thereto, actuators ACT are provided between the sensor frame and the force frame. The controlling is performed by the control device CD which comprises a position sensor input PSI via which position signals from the position sensors are input, an acceleration sensor input ACI via which acceleration signals from the acceleration sensors are input, and an actuator output AO via which the actuators ACT are driven. The control device may, for example, derive a sensor frame damping force signal that represents a force to be exerted on the sensor frame to dampen the sensor frame, using the acceleration signals from the acceleration sensors, or the second time derivative of the position signals, as input. The acceleration sensors may, for example, comprise 6 sensors, each in one degree of freedom, and may together provide an acceleration signal of the sensor frame in 6 degrees of freedom. The control device, may likewise, using the position signals, control a position of the sensor frame by correspondingly providing the sensor frame damping force.

The sensor frame may span relatively large dimensions as the projection system may be relatively large. Therefore, vibration isolation, measurement of the acceleration of the sensor frame and actuating a force onto the sensor frame for damping may extend to different parts of the sensor frame. For example, the sensor frame may be substantially rectangular. Four vibration isolators may be provided to isolate the sensor frame, each at a corner of the sensor frame. Furthermore, a six degree of freedom acceleration signal may be provided by the acceleration sensors. Still further, eight actuators ACT may be provided to exert a force onto the sensor frame. For example 2 actuators near each vibration isolator. For example, proximate to each vibration isolator, an actuator is provided that exerts a force in the vertical direction and an actuator that externs a force in a direction in the horizontal plane. The actuators that exert a force in a direction in the horizontal plane may actuate in different directions in the horizontal plane, for example two actuators exerting a force in one direction and the other two actuators exerting a force in a direction perpendicular thereto.

As indicated above, the inventors have however observed that the attempt to compensate for such disturbances on the sensor frame by means of the damping of the sensor frame accelerations appears to be counter effective, and causing an overall decrease in projection accuracy instead of an envisaged increase in projection accuracy. In particular, a line of sight error appears to increase instead of the envisaged decrease.

Figure 3:
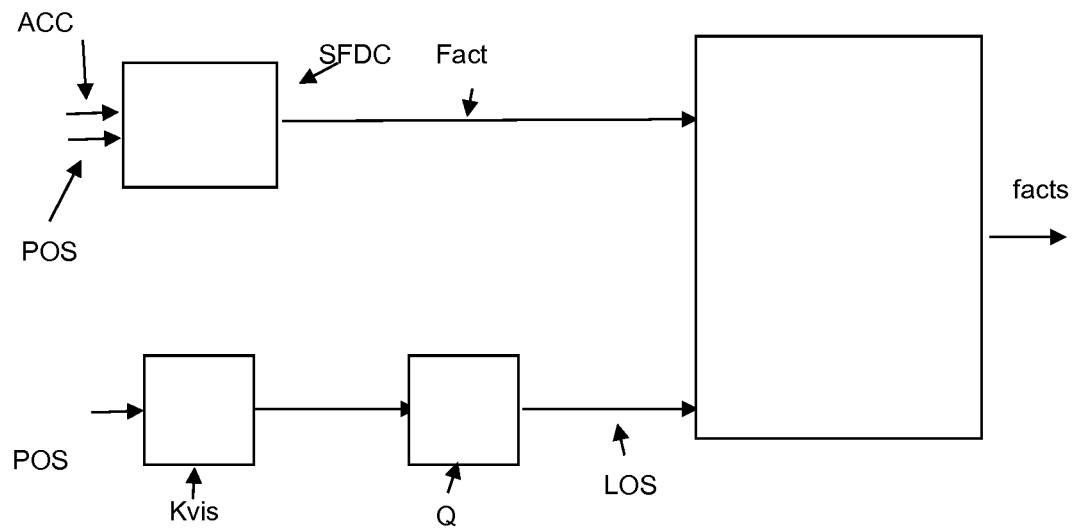
FIG. 3 depicts a control scheme of the lithographic apparatus according to FIG. 2.

FIG. 3 depicts a block schematic view based on which an operation of the control device will be explained. FIG. 3 depicts that a sensor frame damping force signal Fact is determined from the acceleration signals ACC and/or the position signals POS by a sensor frame damping controller SFDC. Any suitable damping function may be applied, e.g. based on acceleration (or velocity) and/or position. A combined damping/positioning may be provided. The sensor frame damping force signal is provided to matrix G, i.e. a matrix calculation as part of the inputs of the calculation. Further input to the matrix calculation is described below.

The position signal that represents the position of the sensor frame is applied to estimate forces induced by the vibration isolators onto the sensor frame. Thereto, it may be assumed that the forces are linearly dependent on a position (assuming for example that the vibration isolators have a linear behavior). It is noted that any other relation may be used here, such as $2^{nd}$ order, etc. Based on the stiffness of the vibration isolators, a force exerted by the vibration isolators onto the sensor frame is estimated using matrix Kvis. The estimated force onto the sensor frame is input to a further determination, namely the determination of a line of sight error that results from the force onto the sensor frame using matrix Q. The line of sight error may be understood as a position error at a substrate level. The estimation of the line of sight error from the force may be derived from modelling or measurement as will be explained in some more detail below. It is noted that, instead of the two step approach whereby the line of sight error is derived from the estimated sensor frame forces which are in turn derived from the position signals, i.e. the cascading of matrix Kvis and Q, the line of sight error may be directly derived from the position signals, e.g. using a single sensitivity function or matrix.

The estimated line of sight error resulting from the (sensor frame) position signals and the calculated sensor frame force are now both input to a matrix G to calculate actuator drive signals that represent the forces to be applied by the actuators onto the sensor frame. Thus, the actuator forces as to be applied onto the sensor frame are derived from the sensor frame damping force in combination with the estimated line of sight error as a result of the position of the sensor frame.

Thus, the matrix G, as may be applied to calculate actuator forces (for the e.g. 8 actuators) from the 6 Degrees of Freedom sensor frame damping force, may be expanded by two extra inputs to provide an 8 times 8 matrix. The two additional inputs are used to compensate for line of sight error created by deformation of the sensor frame as a result of the forces onto the sensor frame by the vibration isolators. Based on position measurement of the sensor frame relative to the force frame, an expected line of sight error is calculated. The expected line of sight error is input to the two additional inputs of the matrix G. As a result, the actuators may induce a sensor frame deformation which counteracts the deformation as created by the vibration isolator stiffness. In order to do so, two sensitivity matrixes are required, one the one hand, the relation between vibration isolator induced sensor frame forces and line of sight error, and on the other hand, the relation between actuator forces and line of sight error. The described concept is based on the insight that the relation between vibration isolator forces and Line of Sight error on the one hand, and actuator forces and Line of Sight error on the other hand, differ to a substantial extent. The relations may be measured using a sensor at a substrate stage, such as a so called transmission image sensor to obtain an indication of line of sight error, while inducing relative frame displacement (e.g. using airmounts) and while applying a force by the actuators.

The effects of the above determination of the actuator drive signals may be two fold: on the one hand, the estimated line of sight error, as would occur as a result of the forces on the sensor frame, may be compensated, as the estimated line of sight error is input to the calculation: thus, the forces as applied by the actuators onto the sensor frame may compensate for this estimated line of sight error.

Secondly, the other input of this calculation, namely the sensor frame damping force signals may no longer generate a line of sight error as the 6 Degree of Freedom actuator forces are in a nullspace of the line of sight error.

Thus, a damping of the sensor frame may be performed, while taking estimated line of sight error as a result of sensor frame forces induced by the vibration isolators into account. The sensor frame damping force signal may be an N degree of freedom sensor frame damping force signal. The estimated line of sight error may be an M degrees of freedom estimated line of sight error, and the actuator drive signals may be N+M actuator drive signals which drive N+M actuators. As a result, the actuator drive signals may be determined from the sensor frame damping force signals and the estimated line of sight error using an N+M times N+M matrix (the matrix G). Thus, use may be made of the additional degree of freedom in that the number of actuators that act on the sensor frame exceeds the degrees of freedom of the sensor frame damping force signal. Actually, the difference between these two enables to feed to the matrix the estimated force signal in as many degrees of freedom as the difference between the number of actuators that act on the sensor frame on the one hand and the degrees of freedom of the sensor frame damping force signal on the other hand.

For example, N may by 6 and M may be 2. The sensor frame damping force signal may thus be provided in 6 degrees of freedom, while applying two extra actuators (thus 8 actuators) and estimating the line of sight error in two degrees of freedom. The line of sight error may be estimated in a plane that is substantially parallel to the surface of the target portion of the substrate, e.g. the horizontal plane. A largest line of sight error is to be expected in the plane parallel to the substrate, hence, a relevant reduction in line of sight error may be provided using the two extra inputs for the line of sight estimation.

As depicted in FIG. 3, the estimation of the sensor frame forces is performed using the stiffness Kvis, representing the stiffness of the vibration isolators. The stiffness may be derived from measurement and/or from simulation, such as a finite element model simulation. For example, the position of the sensor frame may be input as a 6 degree of freedom position, while deriving therefrom a 6 degree of freedom force. Accordingly, matrix Kvis may be a 6 times 6 matrix. The estimated force onto the sensor frame (e.g. in 6 degrees of freedom) is provided to the matrix Q which is used to calculate the estimated line of sight error LOS in 2 dimensions therefrom. Accordingly, in the example of a 6 degree of freedom sensor frame force, the matrix Q will form a 2 times 6 matrix. Using a 6 degree of freedom sensor frame force to calculate the 2 degree of freedom line of sight error may result in an accurate model, as 6 degree of freedom forces may be taken into account and because of the presence of 6 rigid body degrees of freedom. A derivation of the values of matrix Q will be described below with reference to FIG. 4.

As depicted in FIG. 3, the sensor frame damping force signals and the estimated line of sight error are both provided to a matrix G which calculates therefrom the actuator drive signals. A deriving of the values of the matrix G from matrixes V and W is described below with reference to FIG. 4. In the example of 6 degrees of freedom sensor frame damping force signals, a 2 degrees of freedom estimated line of sight error, and 8 sensor frame actuators, the matrix X will correspondingly form an 8 times 6+2 matrix, i.e. an 8 times 8 matrix.

Figure 4:
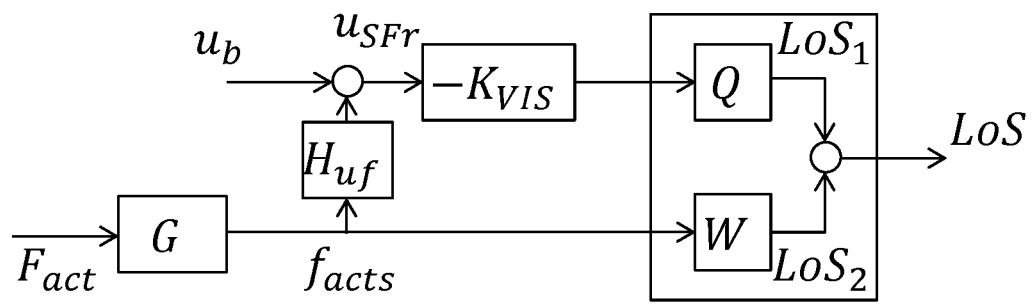
FIG. 4 depicts a control diagram based on which a dimensioning of the lithographic apparatus according to an embodiment of the invention will be explained.

A dimensioning of the matrix Q and the matrix G (from V and W) will now be described with reference to FIG. 4. FIG. 4 depicts how, in the above model, a position of the sensor frame translates into a line of sight error and how a sensor frame damping force translates into a line of sight error, as follows:

FIG. 4 depicts a position $u_b$, $u_b$ being the sensor frame position with respect to the force frame, as induced by motion of the base frame, i.e. not related to the actuator forces but from an external source. Adding a disturbance as a result of the actuators via transfer function $H_{uf}$, the position of the sensor frame $u_{Sfr}$ results. The signal $f_{acts}$ represents the 8 actuator forces. Through a dynamic function $H_{uf}$, this results in a relative sensor frame motion, which is added to the baseframe-induced position $u_b$. The position of the sensor frame $u_{Sfr}$ is measured by the sensor frame position sensors POS in FIG. 2. By means of Kvis, the sensor frame position translates into estimated sensor frame forces $F_{SFr}$. The estimated sensor frame forces translate via the matrix Q into an estimated line of sight error LoS1. The matrix Q has likewise been mentioned above in connection with FIG. 3. The sensor frame forces as a function of the sensor frame position, i.e. Kvis, may be derived from modelling and/or from measurements. Having determined Kvis, the matrix Q can now be derived by measuring the position of the sensor frame while measuring a line of sight error as a function of the position of the sensor frame. In order to position of the sensor frame, the sensor frame may be subject to actuation by the actuators.

FIG. 4 further depicts the sensor frame damping force Fact which is provided to matrix G in order to determine therefrom the actuator drive signals. It is noted that in the configuration in accordance with FIG. 4, the line of sight inputs of the matrix G are left at zero. As indicated above, the matrix G is determined from matrix V and matrix W. The matrix V may be determined as follows: For each of the eight actuators, a resulting 6 degree of freedom force onto the sensor frame is determined as a result of the actuation by that actuator. This provides a total of 8 times 6 numbers, namely 8 actuators and the associated 6 degree of freedom forces on the sensor frame. The numbers provide a 6 times 8 matrix, which can be derived from the geometry (in particular the locations of the actuators) of the sensor frame. Having determined the actuator forces by means of the matrix V, the actuator forces may result in a second line of sight error LoS2 as results from the matrix W. As the line of sight error is estimated in 2 degrees of freedom, while 8 actuators being driven to dampen the sensor frame, the matrix W may form a 2 times 8 matrix. The matrix W may be determined in two ways. As the actuation of the actuators also provides for a movement of the sensor frame, namely via the $H_{uf}$ transfer function, actuation of the actuators may result in further line of sight error, namely the line of sight error as a result of sensor frame forces by the vibration isolators as a result of the movements of the sensor frame. A first possibility is to apply the actuator forces above a cut off frequency of the vibration isolators. For example, the vibration isolators may exhibit a second order roll off, causing a response to be reduced by a factor 16 at 4 times the roll off (resonance) frequency.

A second possibility is to correct for the line of sight error induced by the vibration isolators. This is possible as Kvis as well as Q have been determined. Thus, a line of sight error as a result of the actuation of the sensor frame actuators may be determined, hence providing a matrix which relates the 8 actuator forces of the 8 actuators to the two degrees of freedom line of sight error LoS2. Now knowing matrix V, and matrix W, both the relations between sensor frame damping force and actuator forces, i.e. matrix V, as well as the relation between actuator forces and line of sight (matrix W) are known. The matrix G as depicted in FIG. 3 may now be determined by combining matrix V, (6 times 8) and matrix W (2 times 8) into an intermediate 8 times 8 matrix and inverting the intermediate 8 times 8 matrix to obtain the intended relation between sensor frame damping force and estimated line of sight error on the one hand, and actuator drive signals on the other hand, i.e. matrix G.

Generally speaking, based on the N degrees of freedom sensor frame damping force the M degrees of freedom estimated line of sight error, and the N+M actuators, the matrix V may be M times N+M, the matrix W may be N times N+M, the matrix Q may be N+M times M and the matrix G may be N+M times N+M.

Dimensioning the matrix G, as described above, it is provided that the matrix G is free of introducing line of sight errors. In other words, when translating a sensor frame damping force into a actuator drive signals, no additional forces are generated onto the sensor frame that result in line of sight error, as the 6 Degree of Freedom actuator forces are in a nullspace of the line of sight error.

Figure 5:
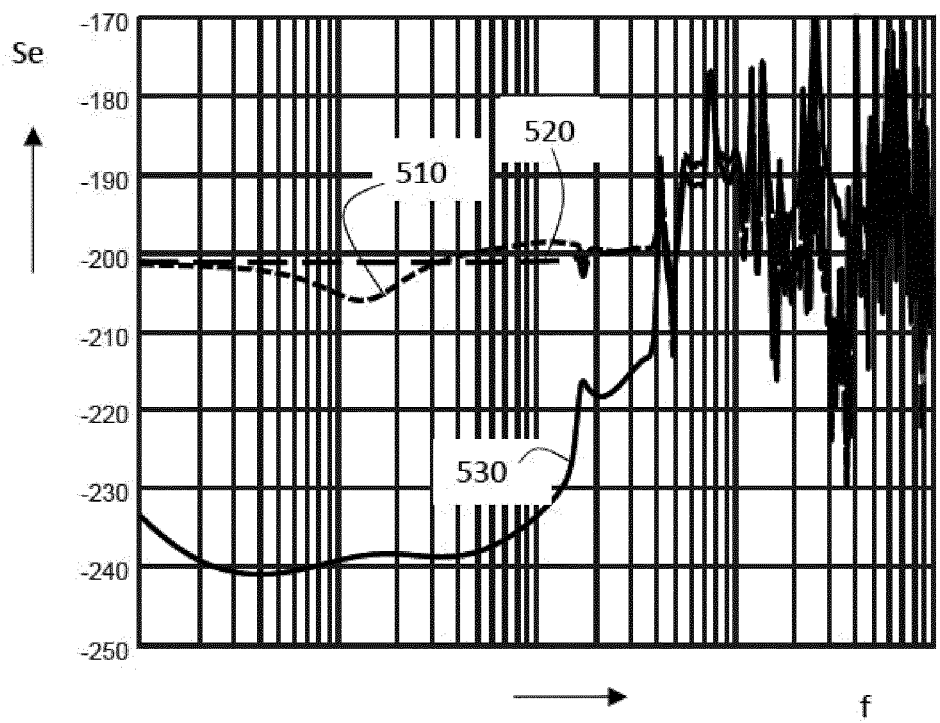
FIG. 5 depicts a frequency diagram based on which a possible effect of the lithographic apparatus according to an embodiment of the invention will be illustrated.

Any other dimensioning of the matrix V may be applied also. In that case, additional line of sight errors may result from the forces onto the sensor frame as generated by the actuators. This line of sight error may likewise be taken into account, i.e. included in the estimated line of sight error that is input to the matrix G, thus being substantially compensated for. FIG. 5 depicts frequency diagrams based on which a possible effect of the above described concept will be explained.

In FIG. 5, a sensitivity Se (line of sigh error as a function of VIS-induced force) in a horizontal direction is depicted along the vertical axis as a function of frequency f along the horizontal axis. The dotted top curve 510 represent an example of the sensitivity according to a prior art solution. The dotted top curve 520 represents an example of the sensitivity using the G matrix as described in the present document, giving the 2 extra inputs a value of 0. The solid bottom curve 530 represents an example of the sensitivity using the line of sight correction as described in the present document. Thus, in embodiments, a low frequency sensitivity for line of sight errors may be reduced.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   a projection system configured to project a patterned radiation beam onto a target portion of a substrate, the projection system comprising:
   a plurality of optical elements configured to optically interact with the patterned radiation beam to project the patterned radiation beam onto the target portion of the substrate,
   a plurality of optical element position sensors,
   a sensor frame to which the optical element position sensors are mounted, the optical element position sensors configured to measure a position of the optical elements in respect of the sensor frame,
   a force frame,
   a plurality of vibration isolators connected between the force frame and the sensor frame, the force frame being configured to support the sensor frame via the vibration isolators, the vibration isolators being configured to isolate the sensor frame from vibrations in the force frame,
a plurality of sensor frame position sensors configured to measure a position of the sensor frame in respect of the force frame,
a plurality of acceleration sensors configured to measure an acceleration of the sensor frame, and
a plurality of actuators arranged between the sensor frame and the force frame and configured to exert a force between the sensor frame and the force frame, and
the lithographic apparatus further comprising a control device, the control device comprising:
an acceleration sensor input to which the acceleration sensors are connected to provide acceleration signals representative of the acceleration of the sensor frame to the control device,
a position sensor input to which the sensor frame position sensors are connected to provide position signals representative of the position of the sensor frame relative to the force frame to the control device, and
an actuator output connected to the actuators to enable the control device to drive the actuators,
wherein the control device is configured to:
derive sensor frame damping force signals from at least one of the acceleration signals and the position signals,
derive an estimated line of sight error from the position signals,
determine actuator drive signals from the sensor frame damping force signals and the estimated line of sight error, and
drive the actuators using the actuator drive signals to dampen the sensor frame and to at least partly compensate the estimated line of sight error,
derive estimated vibration isolators induced sensor frame forces from the position signals, and
derive the estimated line of sight error from the estimated vibration isolators induced sensor frame forces, and
wherein the sensor frame damping force signals are N degrees of freedom sensor frame damping force signals,
wherein the estimated line of sight error is an M degrees of freedom estimated line of sight error,
wherein the actuator drive signals are N+M actuator drive signals,
wherein the plurality of actuators are N+M actuators, and
wherein the actuator drive signals are determined from the sensor frame damping force signals and the estimated line of sight error using an N+M times N+M matrix.

2. The lithographic apparatus of claim 1, wherein N=6 and M=2, and wherein the estimated line of sight error is in 2 directions that define a plane substantially parallel to the target portion of the substrate.

3. The lithographic apparatus of claim 1, wherein the control device is further configured to derive the estimated vibration isolators induced sensor frame forces from the position signals using an N times N sensor frame stiffness matrix (Kvis) expressing N dimensional sensor frame forces as a function of N dimensional position signals.

4. The lithographic apparatus of claim 1, wherein the control device is further configured to derive the estimated line of sight error from the estimated vibration isolators induced sensor frame forces using an M times N sensor frame forces to line of sight error matrix (Q) expressing an M dimensional estimated line of sight error as a function of N dimensional sensor frame forces.

5. A method of reducing a line of sight error in a lithographic apparatus of claim 1, comprising:
determining the actuator drive signals from the sensor frame damping force signals and the estimated line of sight error using the N+M times N+M matrix (G), the N+M times N+M matrix being determined by:
providing an N times N+M matrix (V) expressing an N degree of freedom force on the sensor frame as a result of an actuation of the N+M actuators,
providing an M times N+M matrix (W) expressing a M dimensional line of sight error as a result of the forces of the N+M actuators,
combining the N times N+M matrix (V) and the M times N+M matrix (W) into an intermediary N+M times N+M matrix, and
determining the N+M times N+M matrix (G) as an inverse of the intermediary N+M times N+M matrix.

6. The method of claim 5, wherein an N+M times N matrix part of the N+M times N+M matrix (G) contributes to the actuator drive signals to drive the N+M actuators without resulting in a line of sight error.

7. The method of claim 5, further comprising:
determining the N times N+M matrix (V) from an N degree of freedom torque on the sensor frame as a result of an actuation of each one of the N+M actuators separately, and
determining the M times N+M matrix (W) from the M dimensional line of sight error as a result of the forces of the N+M actuators.

8. The method of claim 7, wherein the determining the M times N+M matrix (W) from the M dimensional line of sight error as a result of the forces of the N+M actuators is performed above a resonance frequency of the vibration isolators.

9. The method of claim 7, wherein the determining the M times N+M matrix (W) from the M dimensional line of sight error as a result of the forces of the N+M actuators comprises subtracting a contribution to the line of sight error as a result of the sensor frame forces induced by excitation of the N+M actuators according to the N+M actuator drive signals.

10. A lithographic apparatus comprising:
a projection system configured to project a patterned radiation beam onto a target portion of a substrate, the projection system comprising:
a plurality of optical elements configured to optically interact with the patterned radiation beam to project the patterned radiation beam onto the target portion of the substrate,
a plurality of optical element position sensors,
a sensor frame to which the optical element position sensors are mounted, the optical element position sensors configured to measure a position of the optical elements in respect of the sensor frame,
a force frame,
a plurality of vibration isolators connected between the force frame and the sensor frame, the force frame being configured to support the sensor frame via the vibration isolators, the vibration isolators being configured to isolate the sensor frame from vibrations in the force frame, a plurality of sensor frame position sensors configured to measure a position of the sensor frame in respect of the force frame, a plurality of acceleration sensors configured to measure an acceleration of the sensor frame, and a plurality of actuators arranged between the sensor frame and the force frame and configured to exert a force between the sensor frame and the force frame, and the lithographic apparatus further comprising a control device, the control device comprising:

an acceleration sensor input to which the acceleration sensors are connected to provide acceleration signals representative of the acceleration of the sensor frame to the control device, a position sensor input to which the sensor frame position sensors are connected to provide position signals representative of the position of the sensor frame relative to the force frame to the control device, and an actuator output connected to the actuators to enable the control device to drive the actuators, wherein the control device is configured to derive sensor frame damping force signals from at least one of the acceleration signals and the position signals, derive an estimated line of sight error from the position signals, determine actuator drive signals from the sensor frame damping force signals and the estimated line of sight error, drive the actuators using the actuator drive signals to dampen the sensor frame and to at least partly compensate the estimated line of sight error, derive estimated vibration isolators induced sensor frame forces from the position signals, and derive the estimated line of sight error from the estimated vibration isolators induced sensor frame forces, and wherein the control device is further configured to estimate the vibration isolators induced sensor frame forces from the position signals using a predetermined sensor frame displacement sensitivity function.

11. A lithographic apparatus comprising:

a projection system configured to project a patterned radiation beam onto a target portion of a substrate, the projection system comprising:

a plurality of optical elements configured to optically interact with the patterned radiation beam to project the patterned radiation beam onto the target portion of the substrate, a plurality of optical element position sensors, a sensor frame to which the optical element position sensors are mounted, the optical element position sensors configured to measure a position of the optical elements in respect of the sensor frame, a force frame, a plurality of vibration isolators connected between the force frame and the sensor frame, the force frame being configured to support the sensor frame via the vibration isolators, the vibration isolators being configured to isolate the sensor frame from vibrations in the force frame, a plurality of sensor frame position sensors configured to measure a position of the sensor frame in respect of the force frame, a plurality of acceleration sensors configured to measure an acceleration of the sensor frame, and a plurality of actuators arranged between the sensor frame and the force frame and configured to exert a force between the sensor frame and the force frame, and the lithographic apparatus further comprising a control device, the control device comprising:

an acceleration sensor input to which the acceleration sensors are connected to provide acceleration signals representative of the acceleration of the sensor frame to the control device, a position sensor input to which the sensor frame position sensors are connected to provide position signals representative of the position of the sensor frame relative to the force frame to the control device, and an actuator output connected to the actuators to enable the control device to drive the actuators, wherein the control device is configured to derive sensor frame damping force signals from at least one of the acceleration signals and the position signals, derive an estimated line of sight error from the position signals, determine actuator drive signals from the sensor frame damping force signals and the estimated line of sight error, drive the actuators using the actuator drive signals to dampen the sensor frame and to at least partly compensate the estimated line of sight error, derive estimated vibration isolators induced sensor frame forces from the position signals, and derive the estimated line of sight error from the estimated vibration isolators induced sensor frame forces, and wherein the control device is further configured to derive the estimated line of sight error from the estimated vibration isolators induced sensor frame forces using a line of sight sensitivity function expressing line of sight error as a function of sensor frame forces.

* * * * *